United States Patent
Hwang et al.

(10) Patent No.: US 7,171,633 B1
(45) Date of Patent: Jan. 30, 2007

(54) ESTIMATING QUALITY DURING EARLY SYNTHESIS

(75) Inventors: Yean-Yow Hwang, Palo Alto, CA (US); Babette van Antwerpen, Mountain View, CA (US); Richard Yuan, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/734,905

(22) Filed: Dec. 12, 2003

(51) Int. Cl.
*G06F 17/50* (2006.01)

(52) U.S. Cl. .............................. 716/2; 716/16; 716/17; 716/18

(58) Field of Classification Search ................. 716/2, 716/16, 17, 18
See application file for complete search history.

(56) References Cited

U.S. PATENT DOCUMENTS

| | | | |
|---|---|---|---|
| 5,537,341 A * | 7/1996 | Rose et al. .................... | 716/16 |
| 5,594,657 A | 1/1997 | Cantone et al. | |
| 5,754,824 A | 5/1998 | Damiano et al. | |
| 5,926,803 A | 7/1999 | Kitano | |
| 6,088,262 A * | 7/2000 | Nasu ..................... | 365/185.04 |
| 6,150,838 A * | 11/2000 | Wittig et al. .................. | 326/39 |
| 6,212,670 B1 | 4/2001 | Kaviani | |
| 6,519,755 B1 | 2/2003 | Anderson | |
| 6,557,144 B1 * | 4/2003 | Lu et al. ........................ | 716/2 |
| 6,590,415 B2 | 7/2003 | Agrawal et al. | |

OTHER PUBLICATIONS

Cong et al., "On Area/Depth Trade-Off in LUT-Based FPGA Technology Mapping", Jun. 1994, IEEE Transactions on Very Large Scale Integration (VLSI) Systems, vol. 2, iss. 2, pp. 137-148.*
Cong et al., "Structural Gate Decomposition for Depth-Optimal Technology Mapping in LUT-Based FPGA Design", Jun. 1966, IEEE Design Automation Conference Proceddings, pp. 726-729.*
Habib et al., "Technology Mapping Algorithms for Sequential Circuits Using Look-up Table Based FPGAS", Mar. 1995, IEEE Fifth Grate Lakes Symposium, VLSI Proceddings, pp. 164-167.*
Rawski et al., "Non-Disjoint Decomposition of Boolean Functions and Its Application in FPGA-oriented Technology Mapping", Sep. 1997, IEEE Proceddings of the 23rd EUROMICRO Conference on New Frontiers of Information Technology, pp. 24-30.*
Martin et al., "A Comparing Study of Technology Mapping for FPGA", Feb. 1998, IEEE Proceddings, Design, Automation and Test in Europe, pp. 939-940.*

(Continued)

*Primary Examiner*—Sun James Lin
(74) *Attorney, Agent, or Firm*—Townsend and Townsend and Crew LLP

(57) ABSTRACT

A computer aided system includes a method of improving the accuracy, optimization, and minimization for the synthesis and mapping of logical functions into the logical structures of a target technology, such as the logic cells (e.g., look-up tables) of a programmable logic integrated circuit. In a specific implementation, the invention incorporates late-stage synthesis operations, such as found during a technology mapping operation, into earlier stage synthesis procedures. These late-stage synthesis operations are used to provide better estimates of delay and area of a final compiled design in order to guide optimization operations.

14 Claims, 12 Drawing Sheets

OTHER PUBLICATIONS

Lu et al., "Technology Mapping for Simultaneous Gate and Interconnect Optimization", Jan. 1999, IEEE Proceddings on Computers and Digital Techniques, vol. 146, iss. 1, pp. 21-31.*

Cong et al., Structural Gate Decomposition for Depth-Optimal Technology Mapping in LUT-Based FPGA Designs, Apr. 2000, IACM Transactions on Design Automation of Electronic Systems, vol. 5, No. 2, pp. 193-225.*

Legl et al., "A Boolean Approach to Performance-Directed Technology Mappings for LUT-Based FPGA Design", Jun. 1996, IEEE Design Automation Conference Proceddings, pp. 730-733.*

Lin et al., "Feasibility of Fixed-Point Transversal Adaptive Filters in FPGA Devices with Embedded DSP Blocks", Jul. 2003, Proceddings, The 3rd IEEE International Workshop on System-on-Chip for Real-Time Applications, pp. 157-160.*

* cited by examiner

Example of a Computer-Aided Design Flow

ESTIMATING QUALITY DURING EARLY SYNTHESIS

BACKGROUND OF THE INVENTION

The present invention relates to the area of electronic design automation of logic designs and in particular, to the aspect of estimating a quality of synthesis operations during logic synthesis.

Integrated circuits are important building blocks of the modern age. Technology continues to evolve and integrated circuits continue to provide improved functionality. As integrated circuits improve, so do the electronics systems that are built using integrated circuits. There are many types of integrated circuit such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including logic gates, products terms, or look-up tables. Programmable logic integrated circuits also included embedded functionality such as user-programmable memory or RAM, digital signal processors (DSPs), and on-board microcontrollers such as ARM-based or MIPS-based controllers.

As integrated circuits become more complex and provide more functionality in a smaller die size, it also becomes increasing difficult to ensure the logic functions are implemented properly and in an optimal way. Modern digital integrated circuits have many transistors and many logic gates, more so than be optimized manually in a reasonable amount of time, especially when time-to-market is critical in ensuring a product's success. As a specific example, a typical programmable logic design surpasses the multimillion-gate mark.

Electronic design automation tools are available to assist engineers with the design and verification tasks. But even with the help of computer-aided tools, the process of optimizing an integrated circuit design can be time-consuming because of the large number of variables involved. It is desirable that the design automation task is done time efficiently even for large designs. Further, it is desirable the design automation tool maximizes performance or otherwise improve an aspect of an integrated circuit design. Some other aspects of a design that a tool may help with include improving critical path performance, removing metastability, reducing the number of logic gates used, checking or verifying functionality, removing race conditions, and others.

An aspect of computer aided design is to optimize and otherwise improve the design of integrated circuits so the resulting design is better for performance criteria, such as taking less area or having better delay or speed characteristics. The performance criteria may be set by a user. As can be appreciated, during the CAD flow, it is important to provide improved techniques to obtain better final results in the obtained or mapped logical function in a target technology, especially by providing better estimates of the performance criteria earlier on during the CAD flow.

BRIEF SUMMARY OF THE INVENTION

The invention is a computer aided system including a method of improving the accuracy, optimization, and minimization for the synthesis and mapping of logical functions into the logical structures of a target technology, such as the logic cells (e.g., look-up tables) of a programmable logic integrated circuit. In a specific implementation, the invention incorporates late-stage synthesis operations, such as found during a technology mapping operation, into earlier stage synthesis procedures. These late-stage synthesis operations are used to provide better estimates of delay and area of a final compiled design in order to guide optimization operations.

In a specific implementation, the invention is a method including generating a netlist for a logic function and performing a first technology mapping on the netlist. After the first technology mapping is complete, a synthesis optimization is performed on the netlist. After the synthesis optimization is complete, a second technology mapping is performed on the netlist. The first technology mapping maps the netlist to the same target technology as the second technology mapping. The logic function may be provided using a high-level design language.

In another implementation, the invention is a method including generating a first alternative netlist for a logic function and generating a second alternative netlist for the logic function, where the second alternative netlist has a different gate configuration from the first alternative netlist. The method further includes selecting one of the first or second alternative netlists as a selected alternative netlist based on results of a technology mapping of the first and second alternative netlists. The method may further include performing a synthesis optimization on the selected alternative netlist to obtain an optimized selected alternative netlist. The method may further include performing a synthesis optimization on the selected alternative netlist to obtain an optimized selected alternative netlist and performing a technology mapping on the optimized selected alternative netlist.

The step of selecting one of the first or second alternative netlists may be based on area. For example, for programmable logic, this may optimize so there are fewer look-up table blocks in the technology mapped netlist. The step of selecting one of the first or second alternative netlists may be based on depth or delay. For example, for programmable logic, this may optimize so there is a shorter depth or path for the look-up table blocks in the technology mapped netlist. The criteria may be set by a user to optimize area or delay.

In an implementation, the invention is a method of computer aided design including providing a description of a first logic function using a high-level design language; synthesizing gates to obtain a first alternative netlist for the first logic function;

performing a technology mapping of the first alternative netlist to obtain a first mapping netlist; synthesizing gates to obtain a second alternative netlist for the first logic function; and performing a technology mapping of the second alternative netlist to obtain a second mapping netlist. One of corresponding first mapping netlist or second mapping netlist is selected based on a comparison of the first mapping netlist with the second mapping netlist based on design criteria. The selected one of the corresponding first mapping netlist or second mapping netlist is a selected mapping netlist. Continuing with synthesis, the selected mapping netlist is optimized. A technology mapping is performed on the second mapping netlist after optimizing.

The design criteria may include optimizing for area or delay. The first mapping netlist may include look-up table structures. The first mapping netlist may include digital signal processing (DSP) blocks. The first alternative netlist may include logic gates. The step of performing a technology mapping of the first alternative netlist to obtain a first mapping netlist may be done a copy of the first alternative netlist. This avoids destroying the first alternative netlist.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
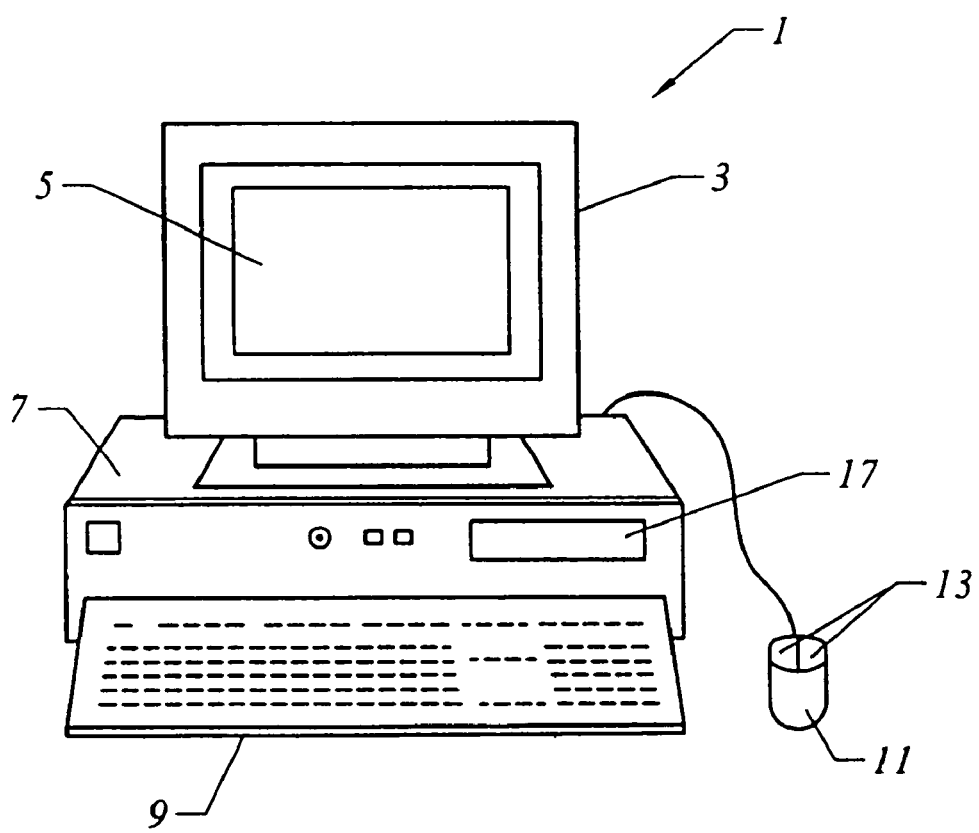
FIG. 1A shows an embodiment of a system of the invention.

FIG. 1A shows a system of the present invention for performing physical resynthesis. In an embodiment, software of the invention executes on a computer workstation system, such as shown in FIG. 1A. FIG. 1A shows a computer system 1 that includes a monitor 3, screen 5, cabinet 7, keyboard 9, and mouse 11. Mouse 11 may have one or more buttons such as mouse buttons 13. Cabinet 07 houses familiar computer components, some of which are not shown, such as a processor, memory, mass storage devices 17, and the like. Mass storage devices 17 may include mass disk drives, floppy disks, Iomega ZIP™ disks, magnetic disks, fixed disks, hard disks, CD-ROMs, recordable CDs, DVDs, DVD-R, DVD-RW, Flash and other nonvolatile solid-state storage, tape storage, reader, and other similar media, and combinations of these. A binary, machine-executable version, of the software of the present invention may be stored or reside on mass storage devices 17. Furthermore, the source code of the software of the present invention may also be stored or reside on mass storage devices 17 (e.g., magnetic disk, tape, or CD-ROM).

Figure 1B:
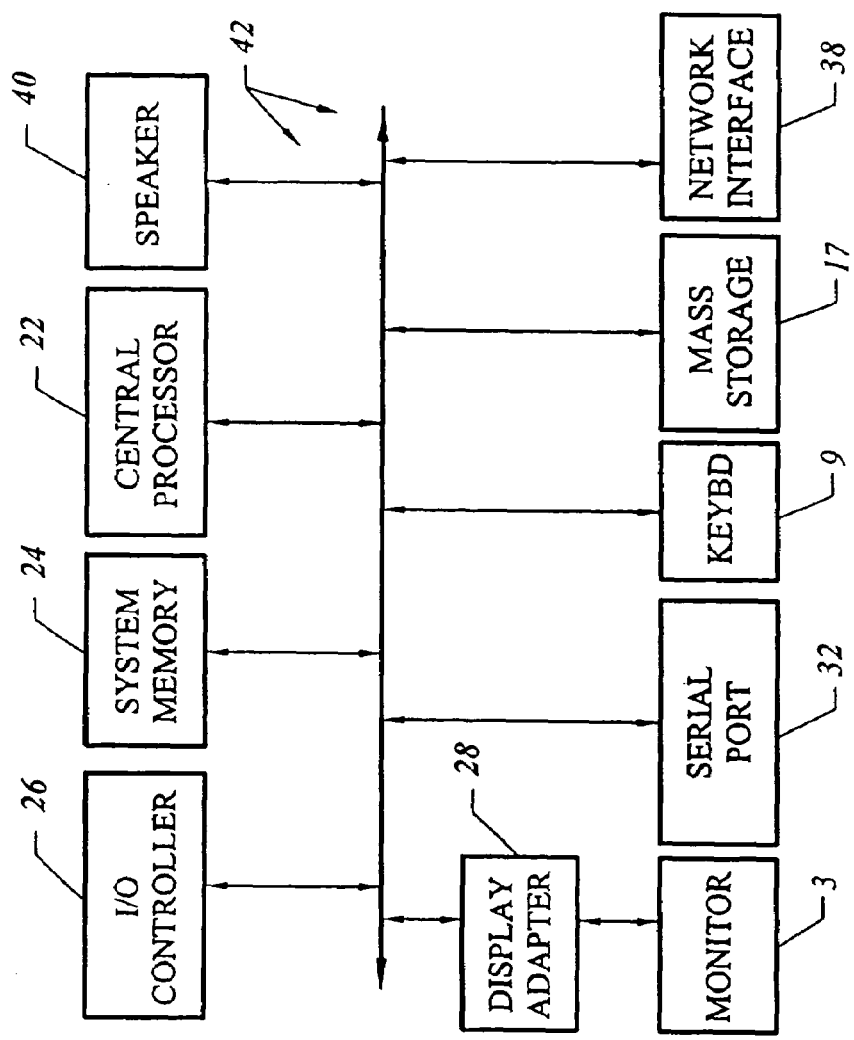
FIG. 1B shows a more detailed block diagram of the system of FIG. 1A.

Furthermore, FIG. 1B shows a system block diagram of computer system 1 used to execute the software of the present invention. As in FIG. 1A, computer system 1 includes monitor 3, keyboard 9, and mass storage devices 17. Computer system 1 further includes subsystems such as central processor 22, system memory 24, input/output (I/O) controller 26, display adapter 28, serial or universal serial bus (USB) port 32, network interface 38, and speaker 40. The invention may also be used with computer systems with additional or fewer subsystems. For example, a computer system could include more than one processor 22 (i.e., a multiprocessor system) or a system may include a cache memory.

Arrows such as 42 represent the system bus architecture of computer system 1. However, these arrows are illustrative of any interconnection scheme serving to link the subsystems. For example, speaker 40 could be connected to the other subsystems through a port or have an internal direct connection to central processor 22. Computer system 1 shown in FIG. 1A is but an example of a computer system suitable for use with the present invention. Other configurations of subsystems suitable for use with the present invention will be readily apparent to one of ordinary skill in the art.

Computer software products may be written in any of various suitable programming languages, such as C, C++, Pascal, Fortran, Perl, MatLab (from MathWorks, www-.mathworks.com), SAS, SPSS, and Java. The computer software product may be an independent application with data input and data display modules. Alternatively, the computer software products may be classes that may be instantiated as distributed objects. The computer software products may also be component software such as Java Beans (from Sun Microsystem), Enterprise Java Beans (EJB from Sun Microsystems). An operating system for the system may be one of the Microsoft Windows® family of operating systems (e.g., Windows 95, 98, Me, Windows NT, Windows 2000, Windows XP), Linux, UNIX, or Sun OS. Other operating systems may be used.

Furthermore, the computer may be connected to a network and may interface to other computers using this network. For example, pattern recognition may be performed via distributed computer through this network, where each computer in the network performs part of the task of the many series of pattern recognition steps in parallel. Furthermore, the network may be an intranet, internet, or the Internet, among others. The network may be a wired network (e.g., using copper), telephone network, packet network, an optical network, or a wireless network. For example, data and other information may be passed between the computer and components (or steps) of a system of the invention using a wireless network using a protocol such as Wi-Fi (IEEE standard 802.11, 802.11a, 802.11b, 802.11g, and 802.11i to name a few examples). For example, signals from a computer may be transferred, at least in part, wirelessly to a programmable logic integrated circuit.

Figure 1C:
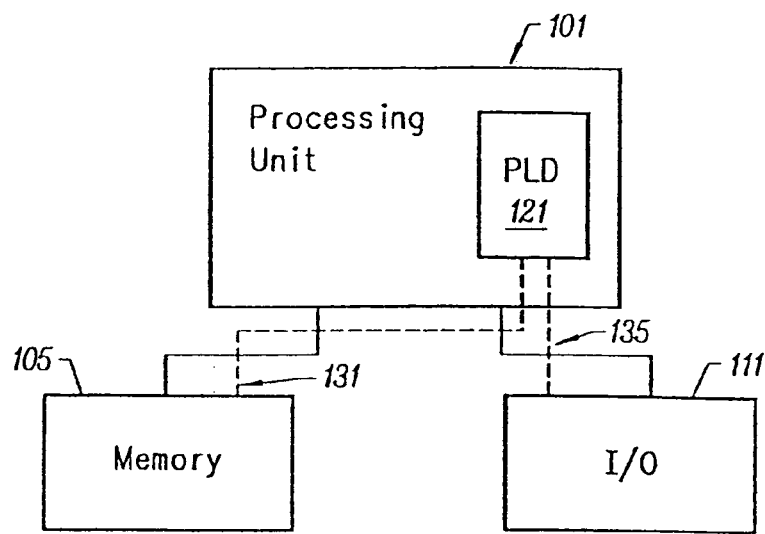
FIG. 1C is diagram of a digital system with a programmable logic integrated circuit.

FIG. 1C shows a block diagram of a digital system, which the invention may incorporate or operate on. The system may be provided on a single board, on multiple boards, or within multiple enclosures. Though embodiments of the present invention are useful in electronic and integrated circuits in general, they are particularly useful in programmable logic devices. FIG. 1C illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs and are sold, e.g., by Altera Corporation of San Jose, Calif. Programmable logic integrated circuits and their operation are well known to those of skill in the art.

In the particular embodiment of FIG. 1C, a processing unit 101 is coupled to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task. Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
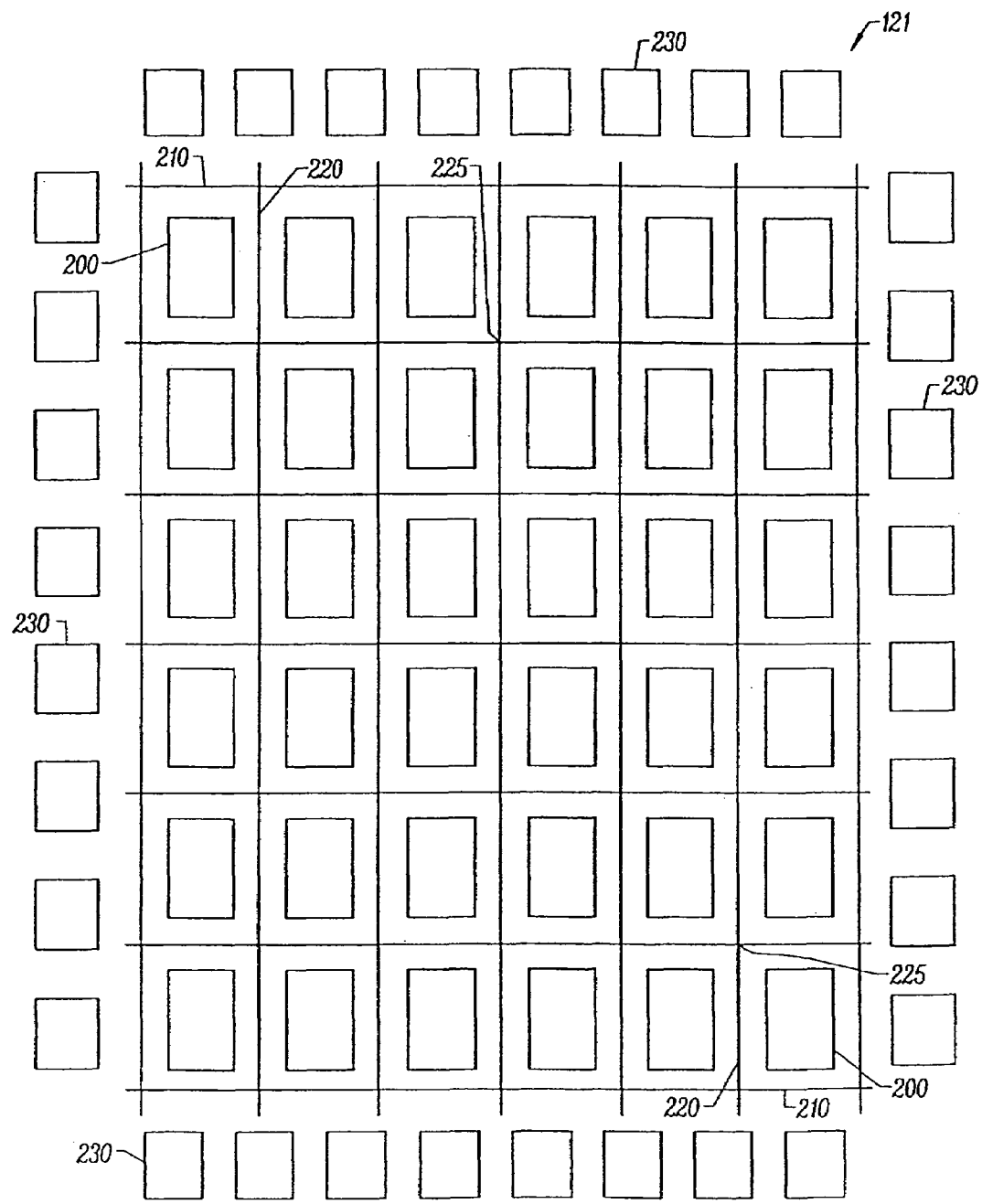
FIG. 2 is a diagram showing a floor plan of a programmable logic integrated circuit.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of horizontal interconnects 210 and vertical interconnects 220. Although shown as single lines in FIG. 2, each set of interconnect lines may represent a plurality of signal conductors. The inputs and outputs of LAB 200 are programmably connectable to these sets of interconnect lines, such that multiple LABs 200 may be connected and combined to implement larger, more complex logic functions than can be realized using a single LAB 200.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
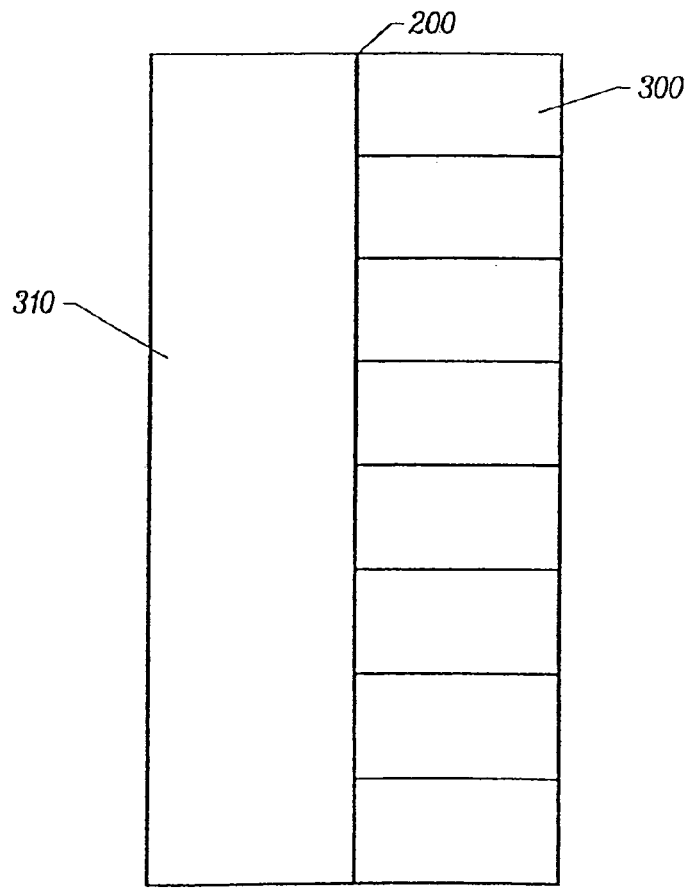
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells" or LCELLs, and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB are connectable to LE 300 through local interconnect structure 310. In one embodiment, LE 300 incorporates a function generator that is configurable to provide a logical function of a number of variables, such a four-variable Boolean operation. As well as combinatorial functions, LE 300 also provides support for sequential and registered functions using, for example, D flip-flops. For example, a logic element includes combinational and sequential blocks. The combinational blocks may be implemented using product terms or a look-up table, as a couple of examples. The sequential block may be a flip-flop, D flip-flop, or register.

LE 300 provides combinatorial and registered outputs that are connectable to the interconnect lines 210 and 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure.

Figure 4:
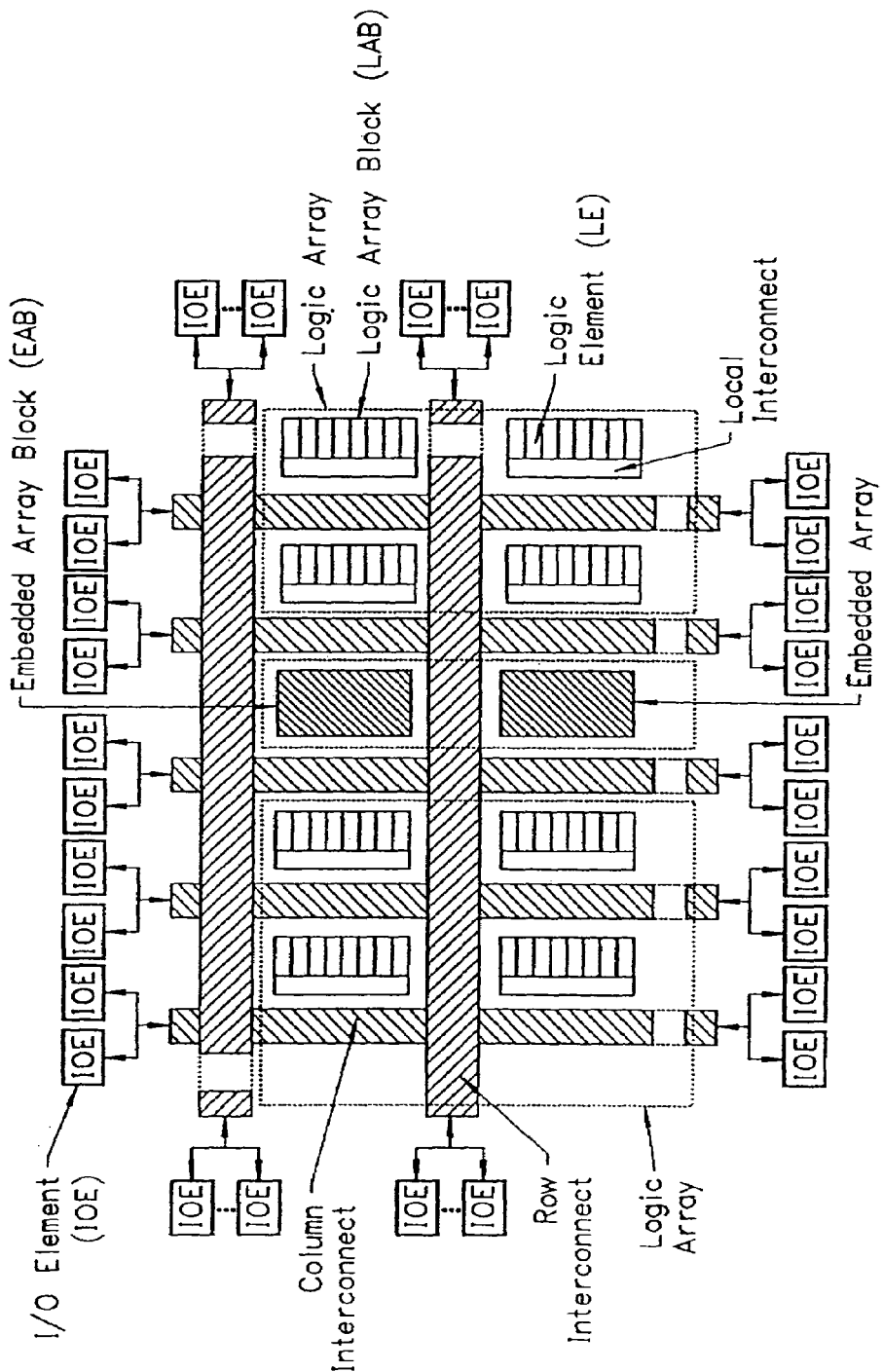
FIG. 4 is a diagram showing a programmable logic architecture with embedded array blocks (EABs) and logic array blocks (LABs).

FIG. 4 shows an example for a typical programmable logic architecture. The architecture in FIG. 4 further includes embedded array blocks (EABs). EABs contain user memory, a flexible block of RAM. The embedded array blocks can be configured as FIFOs acting as frequency translators and serial to parallel converters for interfacing between high-speed input and outputs and the core circuits including the logic array blocks.

Figure 5:
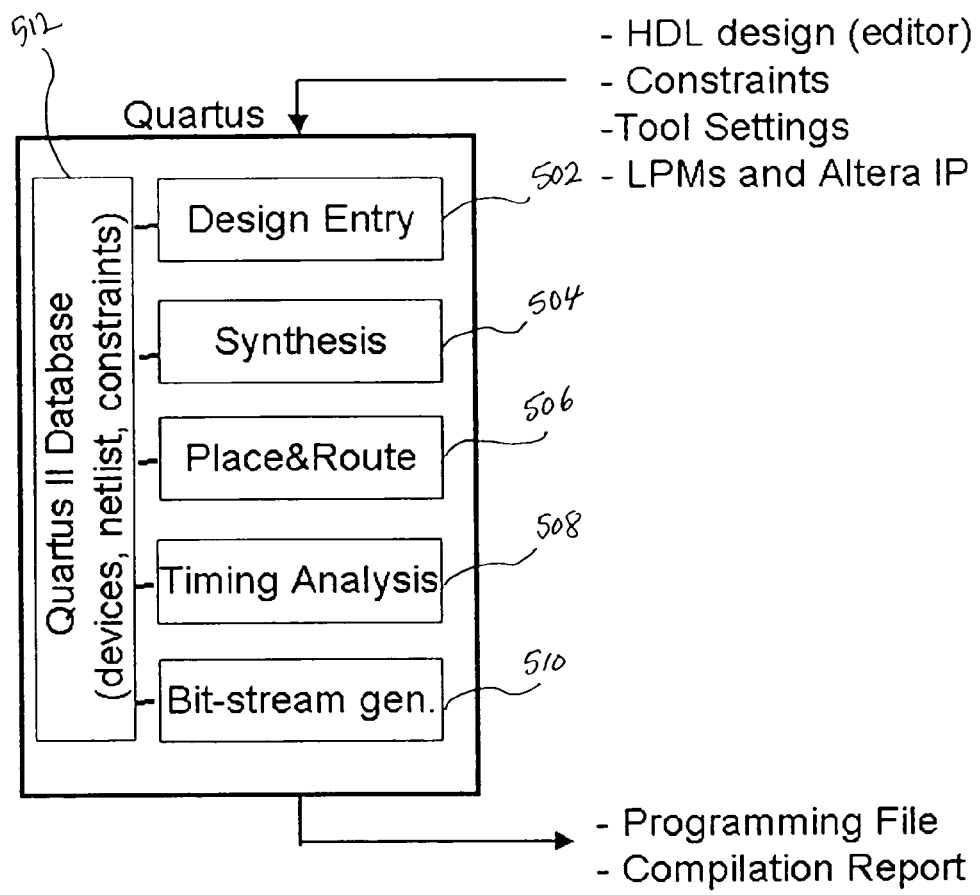
FIG. 5 shows an overall diagram of a computer-aided design (CAD) or electronic design automation (EDA) flow including synthesis.

FIG. 5 shows an example of a flow diagram of a electronic design automation (EDA) or computer-aided design (CAD) tool used in the design of integrated circuits including microprocessors, ASICS, memories, FPGAs, PLDs, and others. In a specific implementation, this flow is used to configure a programmable logic integrated circuit. As discussed above, a user typically programs a programmable logic integrated with the user's desired logic. FIG. 5 is an example of one technique of designing and implementing logic for a programmable logic integrated circuit. At Altera, a particular implementation of the technique of this flow is implemented using a software system referred to as Quartus. This is just an example. One could draw the flow with more or fewer steps and targeting a specific or more general device hardware. The most common implementation of this flow would be as a computer program executing as part of a system similar to that shown in FIG. 1, though other implementations are possible.

The steps of the flow include design entry 502, synthesis 504, place and route 506, timing analysis 508, and bit stream generation 510. Each of these steps in the process may access, store, or retrieve data from a database 512. The database may include devices, a netlist, and constraints.

Design entry is a step of a user specifying his design. Design entry may be performed by schematic capture, entering in logic gates and other logic symbols in a schematic editor. Other techniques of design entry include using a high level design language (HDL) editor. The design is input in a language such as VHDL or Verilog.

Synthesis is a process or method, typically implemented in a software program, for converting the input design from a high-level design language such as VHDL or Verilog into an optimized netlist of gates mapped into the target technology. In the case of programmable logic this often, but not always, includes 4-input lookup-tables (LUTs) and a D-type flip-flops (DFFs). There are many other details and differences not described here.

Synthesis can be either hard-coded as an algorithm, or controlled through a script. Though conceptually similar as a method of computation, the latter is common because it allows for more flexibility and also allows substitute scripts to be used as an option in the flow. The concept of a script for synthesis is largely due to the SIS synthesis system from Berkeley. For more information, see E. M. Sentovich, K. J. Singh, L. Lavagno, C. Moon, R. Murgai, A. Saldanha, H. Savoj, P. R. Stephan, R. K. Brayton, and A. L. Sangiovanni-Vincentelli, *SIS: A System for Sequential Circuit Synthesis*, Technical Report UCB/ERL M92/41, Electronics Research Lab, Univ. of California, Berkeley, Calif. 94720, May 1992.

There are many algorithms in synthesis. The following are some examples of algorithms that are available for calling in a typical synthesis system. A synthesis operation may be to remove redundant logic. Some techniques includes sweep, two-level minimizer, one-hot state machine minimizer, odc (observability don't care) stuck feedbacks, odc combinatorial logic, odc secondary signals, reduce secondary signals, convert silly LUTs to logic, and remove redundant loop cuts. A synthesis operation may include restructuring and removing redundant logic. Some techniques include resynthesizing fan-out-free cones and resynthesizing cones through fan out. A synthesis operation may include restructuring. Some techniques include eliminate, factor sum-of-products, decompose to two inputs, widen, make sum-of-products, and extract aload (i.e., asynchronous load) signals. A synthesis operation may include removing duplicate or redundant combinational logic or registers, extracting common cubes, or XORs. A synthesis step in a CAD flow may include any combination or all of these operations, and may include other operations too.

More specifically, the algorithms to remove redundant logic include: (1) Sweep: propagates constants through the netlist. (2) Two-level minimizer: minimizes the number of AND-gates in each sum-of products. (3) One-hot state minimizer: minimize logic in state machine making use of the knowledge of the possible and impossible states of the registers. (4) Odc stuck feedbacks: remove registers and combinational loops that are stuck at some specific value due to a feedback from their own output. (5) Odc combinatorial logic: observability don't care minimization that uses knowledge about when a gate value is not observable to minimize it. (6) Algorithms to reduce secondary signals: minimize secondary signals on registers. (7) Convert silly LUTs to logic: absorb more input logic in existing LUTs if possible. Convert LUTs of which not all inputs are used into simple combinatorial gates. (8) Remove redundant loop cuts: remove cut buffers that are not part of a combinatorial loop.

The algorithms to restructure logic include: (1) Eliminate: flatten logic into less levels. (2) Factor sum-of-products: apply algebraic factoring on a sum-of-products to add more levels of logic. (3) Decompose to two inputs: decompose each AND, OR and XOR gate with more than two inputs into a tree of gates each with two inputs. (4) Widen: flatten trees of the same type of gates w/o inverters into one gate with more inputs. (5) Make sum-of-products: change the logic so that it is built up of sum-of-products only (a sum-of-products is an OR gate fed by AND-gates only, such that there are no inverters between the AND and OR gates, and each AND gate fans out only to this OR gate). (6) Extract aload signals: change registers to use asynchronous load instead of clear and preset.

The algorithms to restructure and remove redundant logic include: (1) Resynthesize fanout free cones: flatten fanout free cones into sum-of-products, call two-level minimizer and factoring algorithm on sum-of-products. (2) Resynthesize cone through fanout: flatten any cone into sum-of-products, call two-level minimizer and factoring algorithm on sum-of-products.

The algorithms to share duplicate logic: (1) Extract cubes: extract common AND gates from different AND gates in the netlist, and extract common OR gates from different OR gates in the netlist. (2) Extract common XORs: extract common XOR gates from different XOR gates in the netlist. (3) Remove duplicate logic: remove gates with the exact same inputs as other gates and redirect their fanout to the duplicate gate. (4) Remove duplicate registers: remove registers with the exact same inputs as other registers and redirect their fanout to the duplicate register.

In an implementation, technology mapping (or tech mapping) is part of synthesis, and generally comes at the end of synthesis. In an alternative implementation, tech mapping may be part of the place and route. Tech mapping converts the netlist into another which matches the logic structure of the target architecture. For example, for programmable logic, tech mapping converts the netlist into a format for the logic blocks, look-up tables, flip-flops, and other logical elements of the programmable logic architecture.

Table A below shows an example of a synthesis script.

TABLE A

1. Minimize logic
    two-level minimizer, odc, remove duplicate logic, DFFs
2. Collapse to remove structure
    Eliminate
3. Minimize & add structure 1
    Two-level minimizer, factor, resynthesize
4. Minimize & add structure 2
    Two-level minimizer, factor, resynthesize
5. Extract duplicates
    Remove duplicate logic, DFFs, extract common cubes Synthesis need not be part of the same system as the other parts of the flow. In particular, any number of separate tools could perform the synthesis operation and then feed the resulting technology-mapped netlist into the middle part of the flow. For example, synthesis tools produced by the Synplicity Corp. of Sunnyvale, Calif. or Mentor Graphics Corp. of Wilsonville, Oreg. produce synthesis tools which directly feed the Quartus CAD tools produced by Altera Corp. of San Jose, Calif.

In these cases, one may refer to the first synthesis as arising from a "third party tool" (where the first party is our tool and the traditional second party being the user of the tool). Because the third-party tool provides a netlist which is already synthesized, the first-party tool treats this as a "WYSIWYG" netlist. WYSIWYG stands for "what you see is what you get."

Place and route is a process or method of choosing individual physical locations on a chip, board or other physical hardware implementation for each cell in the netlist, and then performing the connections between them. Placement places cells of the netlist into the target hardware architecture. Routing performs physical wiring connections between cells. For the specific embodiment of programmable logic, this means determine which logic elements (and their look-up tables) implement particular functions and how the signals are routed using the interconnect, global and local.

Timing analysis determines the electrical or other delay and thus the performance or timing of the eventual hardware. For example, timing analysis evaluates the delays between registers and I/Os to determine the potential performance (i.e., speed) of the design. Using timing analysis, a user will have a good estimate as to the performance of his logic implemented in the integrated circuit (e.g., programmable logic). At this point, the design has not been implemented in the device, and the user can change the design as needed to obtain the performance the user desires. For example, if the speed path is not fast enough, the user can make design changes and go though the CAD flow again. Design is sometimes an iterative process, where the user tries a design, sees the results using timing analysis, makes changes to the design, and sees the results again. This process may be repeated many times as needed.

The step of "bitstream generation" is specific to the example of FPGA or PLD devices which are programmed by a bitstream. In particular, the design is converted into a stream of bits that will be loaded into the FPGA or PLD device to configure it to the user's design. This step is optional since it is not needed for certain integrated circuits, such as ASICs (which are hard-programmed using masks or lasers instead of a bitstream).

Each of these steps in the FIG. 5 flow above is commonly broken down into further steps. In an embodiment, the invention is a resynthesis technique and may add additional steps to the flow or may be additional steps within one of the existing steps.

Technology mapping maps into the cells, placement puts the cells into the integrated circuit, and routing connects the cells in the integrated circuit. This will then be physically implemented in an integrated circuit by programming or configuring it.

Further discussion of CAD flows for programmable logic are discussed in U.S. patent application Ser. No. 10/461,921, filed Jun. 12, 2003, U.S. patent application Ser. No. 10/446,650, filed May 27, 2003, which are both incorporated by reference. The techniques of the invention may be applicable to or combined with, or both, the flows and techniques described in these applications.

In a specific embodiment, this invention is a method of incorporating late-stage synthesis operations (i.e., technology mapping algorithms) into early-stage synthesis procedures (i.e., general logic minimization and synthesis algorithms) for estimating delay and area of final compiled designs. Referring to FIG. 5, the technology mapping algorithms typically are utilized at the end of a synthesis step 504 or in the place and route step 506.

In brief, the technology mapping routines are extracted and used as an accurate quality (area and delay) estimator by the early-stage synthesis procedures to guide optimization operations.

Logic synthesis is conventionally divided into the early (technology independent optimization) and late (technology mapping) stages. In the past, early-stage logic synthesis employs quality measures such as number of literals and number of gate-levels to guide the optimization of Boolean networks. Such measures, however, do not correspond to the area (i.e., number of LUTs) and depth (i.e., number of levels) of LUT networks in the late synthesis stage. An empirical formula is thus used at early synthesis stage to estimate late-stage synthesis quality. For example, the depth of LUT network is estimated as one half of the depth of Boolean gate network.

A problem with using an empirical formula approach is its lack of accuracy, which causes early-stage synthesis to accept inferior logic minimization solutions suggested by the false quality numbers derived from the empirical formula. To cope with this problem, the inventors developed a method that can produce accurate estimation on quality of results at early synthesis stage.

The method of the invention produces accurate area and delay estimation on final mapping results at early synthesis stage, thereby enabling early-stage technology independent optimization routines to choose solutions that lead to the best final results.

Figure 6:
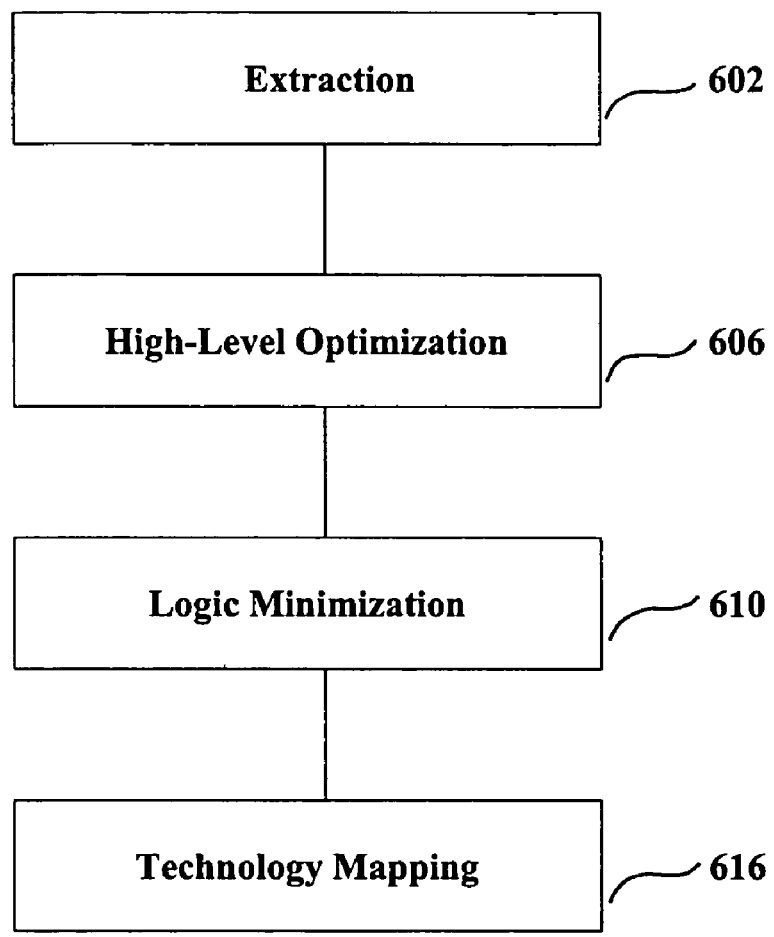
FIG. 6 shows a flow diagram of four stages of a synthesis flow.

This patent describes a way to better estimate the number of logic cells and the circuit depth during early stages of synthesis. Synthesis translates users' HDL source into a netlist of logic cells (Icells), I/Os, and hard blocks like DSP blocks and memory blocks. Traditionally, as shown in FIG. 6, synthesis is divided into four independent stages: (1) extraction 602, (2) high-level optimization 606, (3) logic minimization 610, and (4) technology mapping 616. As discussed above, these stages may be allocated all within synthesis 504 of FIG. 5 (as discussed in this application), or may be divided among different steps of the FIG. 5 flow, such as synthesis and place and route 506. These four stages may be divided or allocated in any way within the FIG. 5 CAD flow.

Extraction 602 takes a users' HDL source and translates it into a netlist that is a mixture of simple logic gates, registers, and operators such as adders, multipliers, encoders, decoders, and multiplexers. High-level optimization 606 takes this netlist and translates it into a netlist of only simple gates, registers, and some hard blocks like arithmetic chains, DSP blocks, and memory blocks. Logic minimization 610 takes the netlist of simple gates, registers, and hard blocks, and tries to minimize the simple gates such that a netlist results which is better for technology mapping.

Finally, technology mapping 616 takes the minimized netlist of simple gates, registers, and hard blocks, and maps the simple gates to LUTs or other specific structures of the target technology. For other technologies, the logic structures may be product terms, memory blocks, multiplexers, programmable cells, logic gates, or other logic Technology mapping then translates this netlist into a netlist of logic cells (e.g., lcells with LUTs), I/Os, and hard blocks.

Each of the four stages in synthesis has the same goal: to end up with a netlist that has small area (which is the number of lcells in the netlist) and has small circuit depth (which the maximum number of combinational lcells on any path from input or register to output or register.) The combination of good area and good depth will give good fmax and good area after place and route.

Traditionally, the first three stages in synthesis have not used accurate metrics for estimating area and circuit depth after technology mapping, simply because they don't have the mapping yet. The most used metric for area is the number of two input gates in the netlist. For circuit depth, the most used metric is the maximum two input gate depth. The following examples show why these metrics are not necessarily accurate.

Figure 7:
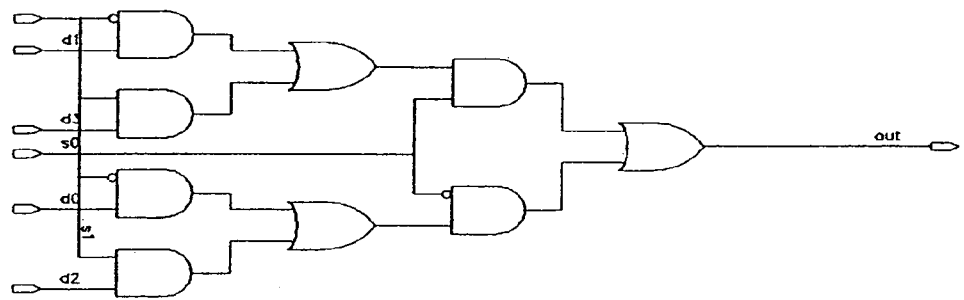
FIG. 7 shows a simple gate representation of a four-to-one multiplexer function with nine two-input gates.
Figure 8:
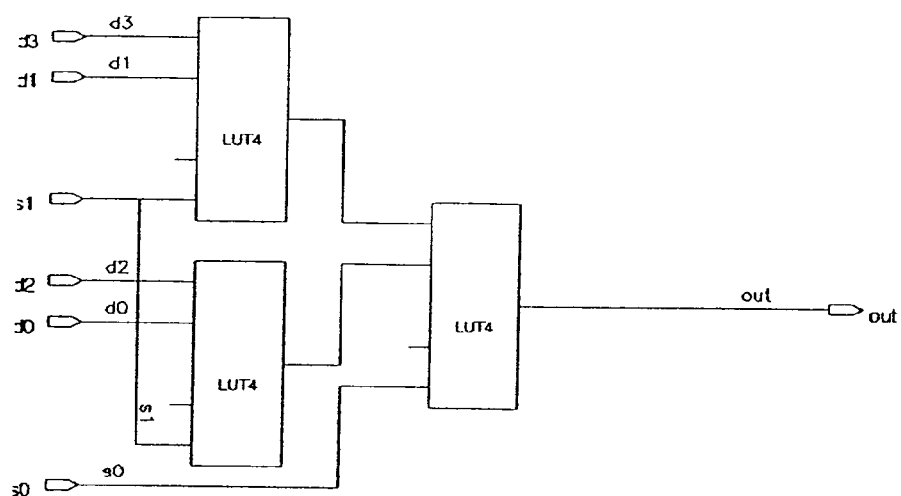
FIG. 8 shows a mapping of the function in FIG. 7 using four-input look-up table circuits.

For instance, consider the 4-to-1 multiplexer function: out=s0's1'd0+s0s1"d1+s0's1d2+s0s1d3. FIG. 7 shows a simple gate representation of this function with nine two-input gates. This is the optimal number of two input gates that one can obtain for any netlist for this function. If this netlist is mapped to four-input LUTs, one obtains the netlist in FIG. 8. Note that this netlist has three LUTs.

Figure 9:
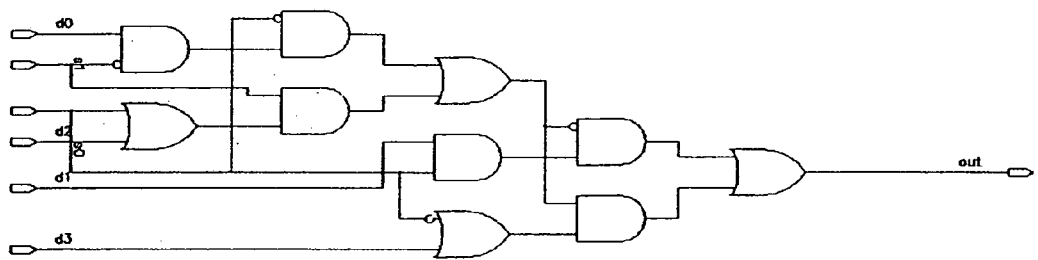
FIG. 9 shows another representation of the four-to-one multiplexer that uses ten two-input gates.
Figure 10:
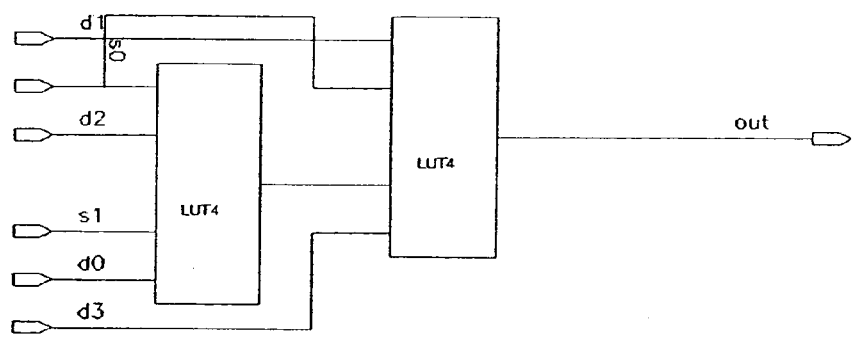
FIG. 10 shows a mapping of the function in FIG. 9 using four-input look-up table circuits.

FIG. 9 shows another representation of the four-to-one multiplexer that uses ten two-input gates. However, when we map this netlist to four-input LUTs, we obtain a netlist with two four-input LUTs as shown in FIG. 10. So as can be seen, if a decomposition with a minimum number of gates for this function (as in FIG. 7) is selected, one would not find the mapping with minimum number of LUTs (in FIG. 10).

Figure 11:
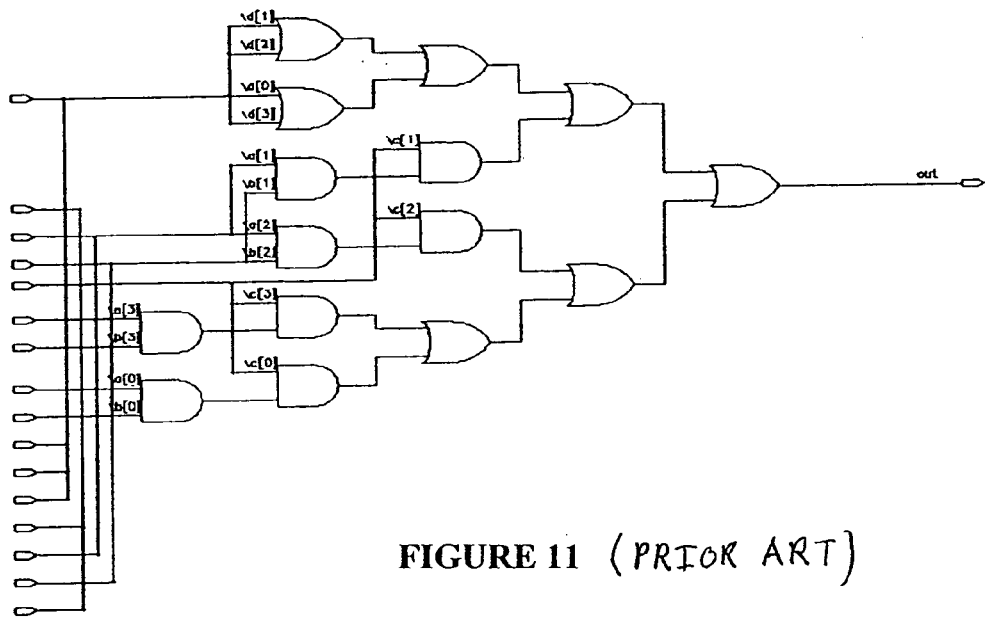
FIG. 11 shows a netlist of a function.
Figure 13:
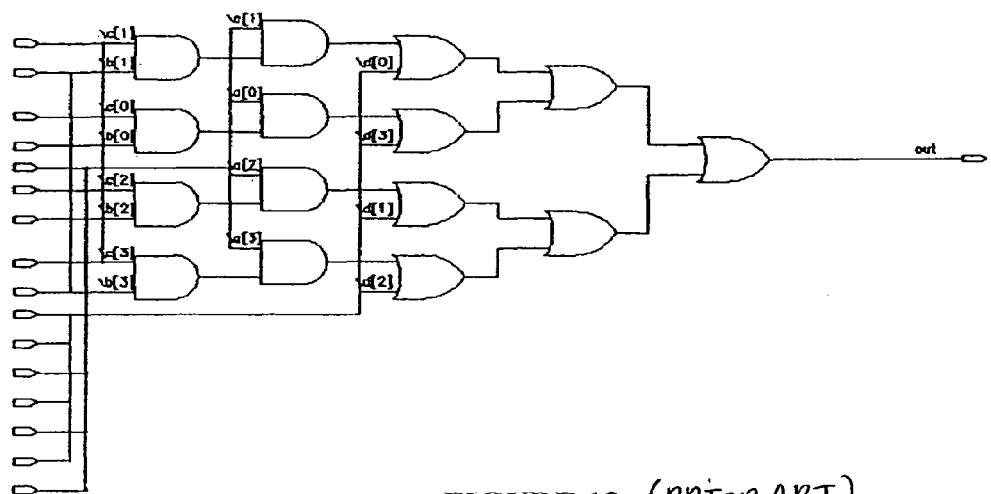
FIG. 13 shows a structurally different netlist of the same function as that in FIG. 11.

FIGS. 11 and 13 represent the same function but with structurally slightly different netlists. Both netlists have exactly the same number of two-input gates and the same gate depth. The netlist of FIG. 11 may be considered better for circuit depth, since it has fewer two-input gates of maximum gate depth.

Figure 12:
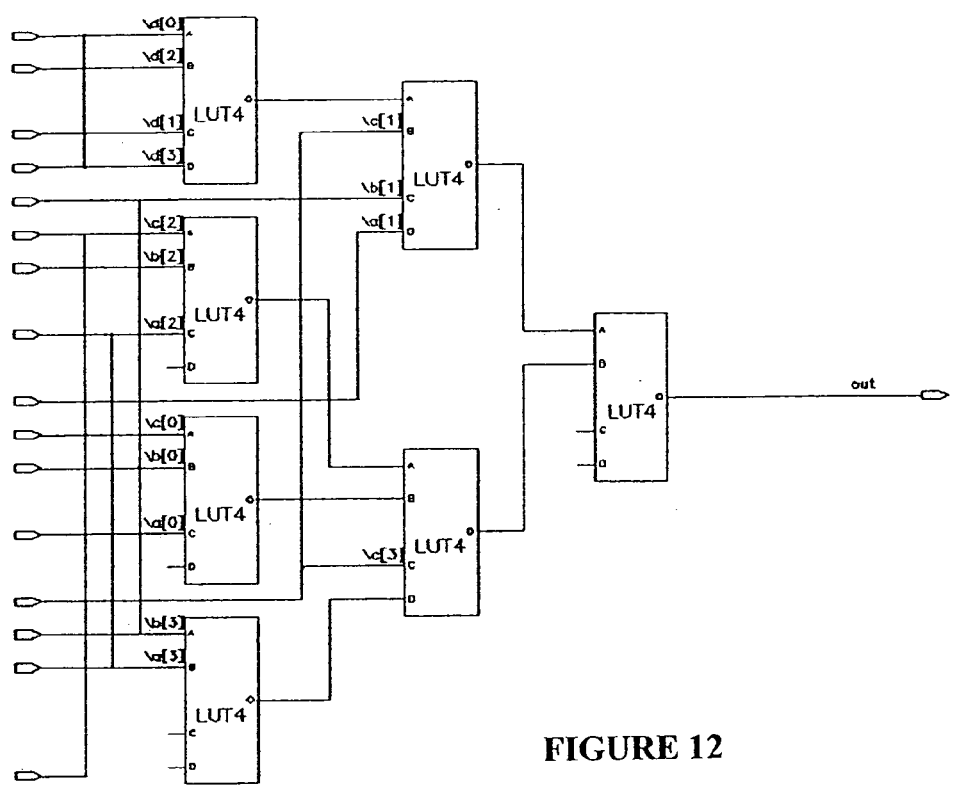
FIG. 12 shows a mapping of the netlist of the function in FIG. 11 into four-input look-up tables.
Figure 14:
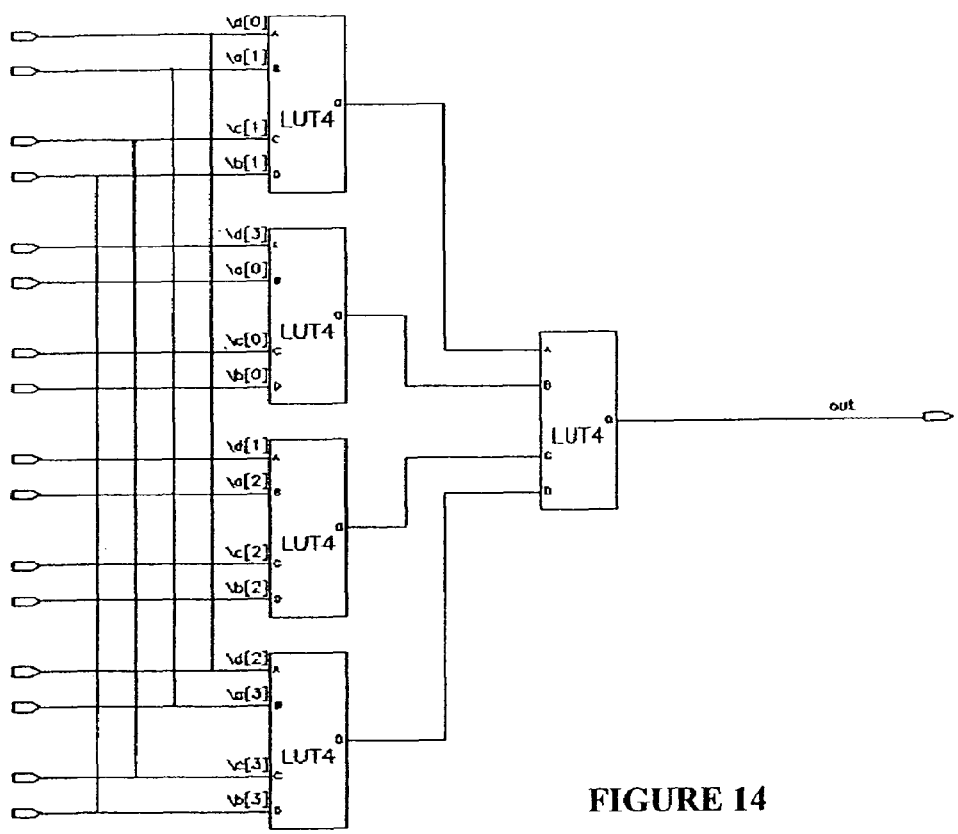
FIG. 14 shows a mapping of the netlist of the function in FIG. 13 into four-input look-up tables.
Figure 15:
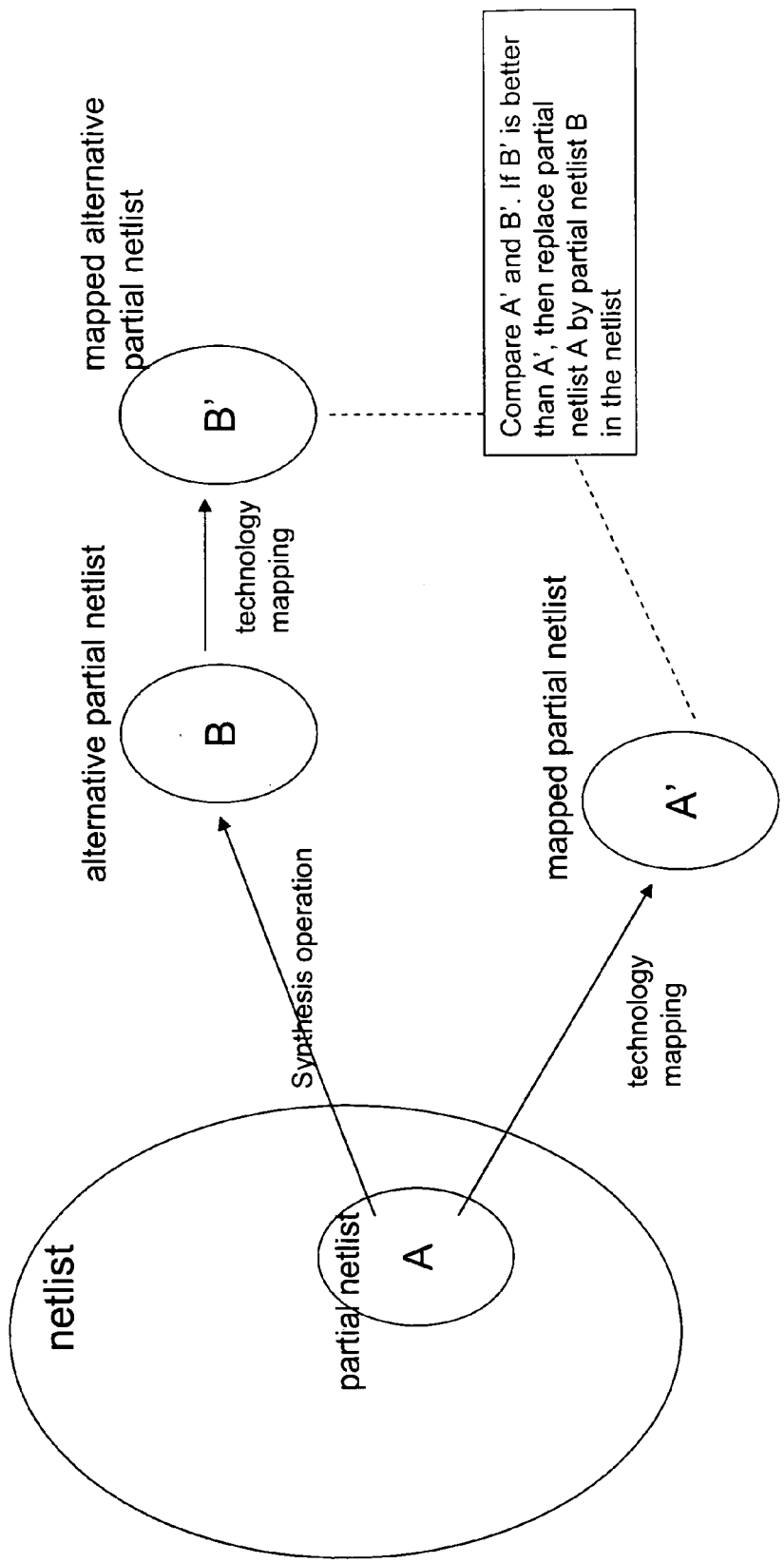
FIG. 15 shows a method of mapping a partial netlist according to an embodiment of the invention.

FIGS. 12 and 14 show mappings to four-input LUTs of the netlists in FIGS. 11 and 13, respectively. As can be seen the mapping of FIG. 14 is far superior over the mapping of FIG. 12: it has smaller circuit depth and uses fewer LUTs.

An aspect of the invention described in this patent is a tool to do a better estimation of final number of lcells and final circuit depth during the first stages of synthesis, and methods to use this tool. In an embodiment, the tool to do the estimation is called EstMap. In a specific implementation, the EstMap routines are based on the same algorithms that are used in the technology mapping phase, which makes it accurate by definition. Table B below provides pseudo code for an estimator routine of the invention.

TABLE B

```
for (first alternative netlist . . . last alternative netlist)
    /* the synthesis operation generates various alternative netlist embodi-
    ments of the functionality indicated by a user, such as provided
    by an HDL file */
{
estimate (delay, area)
    /* e.g., map this netlist alternative to target technology, such as
    LUTs. The estimate can optimize for delay or area, which may be
    user-selected option. */
compare and save if the best result so far
    /* compare the result of the mapping of this netlist alternative to
    best result so far and save if better */
}
use the best result
    /* use the best result obtained in the loop above, optimizing for
    delay or area */
```

The main input to EstMap is a netlist of synthesis gates (i.e., gates results from synthesis operation, such as those gates in FIG. 7 FIG. 7 or 9), which may either be a complete netlist with inputs and outputs, or a subnetlist of a complete netlist, defined by boundary gates. EstMap also has a Boolean parameter which tells it to map for best area or for best speed (similar to a logic option that the customer can set). Output of EstMap is the mapped version of the netlist and information about the number LUTs used in the mapping and the circuit depth of the mapped netlist. EstMap is a very fast algorithm, which means it can be used many times during synthesis without significantly increasing the total compile time.

Referring to FIG. 6, EstMap is a reduced version of the technology mapping routine found in technology mapping step 616. This EstMap routine is used earlier in the synthesis flow in high-level optimization step 606 (instead of only during technology mapping step 616) to determine which alternative of the synthesis gate extraction provides the best results for delay or area, or both. This particular alternative of the synthesis gate extraction is then used for further optimization operations and logic minimization operations 610.

In an implementation, the EstMap routine is a reduced version of the routine used in the technology mapping routine. EstMap would provide a nondestructive estimation and be transparent to the calling routine. For example, the EstMap may first make a copy of the existing synthesis extraction (i.e., synthesis gates) and do a mapping of this copy. Typically in the technology mapping routine, the mapping is done and the original synthesis extractive is not saved.

The following paragraphs discuss different ways in which EstMap can be used during synthesis. EstMap may be used for state machine processing. State machine processing takes place during high-level optimization. In this phase it is decided how the states of each state machine are encoded. Different encodings of states lead to different logic for transition from one state to the next (also called next state logic). Different next state logic may lead to very different resource usage in term of area and depth. It is not obvious which type of encoding will lead to better resource usage. Therefore it is useful to try a couple of different encodings of states, compute the nextstate logic for each encoding, and then use EstMap to estimate the number of LUTs and the LUT depth needed for this encoding.

EstMap may be used for DSP block balancing. During the high level optimization stage of synthesis, a design may have many pieces of logic that are suitable for implementation in a DSP block. The number of DSP blocks on each chip is limited, so it is not always possible to use a DSP block for each such block. Any logic that can not be implemented in a DSP block will be implemented in regular logic. The number of DSP blocks available on the chip depends on the device that the customer selects. The customer can also select auto device, which tells the compiler to select the best device for this design. If auto device is selected, the compiler will select a device after synthesis, which means that during high level optimization, the number of available DSP blocks is still unknown. With EstMap however, one can estimate how many logic cells the design will need after synthesis, and thus one can estimate which device will be selected after synthesis. With this estimate it can be decided how many DSP blocks can be used.

EstMap may be used for logic resynthesis. An important algorithm in logic minimization is resynthesis. For more detail, see U.S. patent application Ser. No. 10/461,921, filed Jun. 12, 2003. This algorithm takes a cone of logic in the netlist and restructures it in different ways. It then decides which implementation is the best (in terms of area and/or depth): the original or one of the restructured versions. It then picks the best implementation and replaces the cone by this one. It selects cones of logic in the netlist, and restructures them. Originally this algorithm used the number of two input gates and the gate depth of the cone as estimates to decide which implementation is best. By using EstMap to determine the amount of area and depth that each implementation will use, we will be able to make a more accurate decision.

EstMap may be used for secondary signal synthesis. During high level optimization, it is decided which synchronous secondary signals will be used for each register. These include clock enable, synchronous clear, and synchronous load signals. These synchronous secondary signals have the property that they can either be implemented in logic, or use the lab wide dedicated signals on the chip. These lab wide signals don't come entirely for free, because each LAB can only handle a limited number of different signals of each type. However, if using a secondary signal saves logic cells or decreases circuit depth, it is generally good. During high level optimization, we can use EstMap to make an estimated mapping of all possible implementations of the register and its feeding cone, with respect to secondary signals. The area and depth returned by EstMap will provide enough information to decide which implementation is best in this particular case.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method of computer aided design comprising:
   providing a description of a first logic function using a high-level design language;
   synthesizing gates to obtain a first alternative netlist for the first logic function;
   performing a technology mapping of the first alternative netlist to obtain a first mapping netlist;
   synthesizing gates to obtain a second alternative netlist for the first logic function, wherein the second alternative netlist has a different gate configuration from the first alternative netlist;
   performing the technology mapping of the second alternative netlist to obtain a second mapping netlist;
   selecting one of corresponding first alternative netlist or second alternative netlist based on a comparison of the first mapping netlist with the second mapping netlist based on design criteria, wherein the selected one of the corresponding first alternative netlist or second alternative netlist is a selected netlist;
   optimizing the selected netlist based on the corresponding mapping netlist; and
   performing the technology mapping on the selected netlist after optimizing.

2. The method of claim 1 wherein the design criteria includes optimizing for area.

3. The method of claim 1 wherein the design criteria includes optimizing for delay.

4. The method of claim 1 wherein the first mapping netlist comprises look-up table structures.

5. The method of claim 1 wherein the first alternative netlist comprises logic gates.

6. The method of claim 1 wherein the step of performing a technology mapping of the first alternative netlist to obtain a first mapping netlist is done on a copy of the first alternative netlist.

7. The method of claim 1 wherein the first mapping netlist comprises digital signal processing blocks.

8. The method of claim 1, wherein performing the technology mappings of the first and second alternative netlists comprises estimating technology mappings of the first and second alternative netlists to obtain the first and second mapping netlists.

9. A method of logic synthesis comprising:
   generating a first alternative netlist for a logic function;
   generating a second alternative netlist for the logic function, wherein the second alternative netlist has a different gate configuration from the first alternative netlist; and
   selecting one of the first alternative netlist or the second alternative netlist as a selected netlist based on results of a technology mapping of the first alternative netlist and the second alternative netlist; and
   optimizing the selected netlist based on the results of the technology mapping of the first alternative netlist and the second alternative netlists; and
   performing the technology mapping on the selected netlist after the optimizing.

10. The method of claim 9 further comprising:
    performing a synthesis optimization on the selected alternative netlist to obtain an optimized selected alternative netlist.

11. The method of claim 9 further comprising:
    performing a synthesis optimization on the selected alternative netlist to obtain an optimized selected alternative netlist; and
    performing a technology mapping on the optimized selected alternative netlist.

12. The method of claim 9 wherein the selecting one of the first alternative netlist or the second alternative netlists is based on area.

13. The method of claim 9 wherein the selecting one of the first alternative netlist or the second alternative netlists is based on depth.

14. The method of claim 9 wherein the first alternative netlist comprises digital signal processing blocks.

* * * * *